(12) United States Patent
Miller

(10) Patent No.: US 8,049,946 B2
(45) Date of Patent: Nov. 1, 2011

(54) LUBRICATING MICRO-MACHINED DEVICES USING FLUOROSURFACTANTS

(75) Inventor: Seth Miller, Englewood, CO (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/794,250

(22) Filed: Jun. 4, 2010

(65) Prior Publication Data

US 2010/0242258 A1    Sep. 30, 2010

Related U.S. Application Data

(62) Division of application No. 11/934,776, filed on Nov. 4, 2007, now Pat. No. 7,738,154, which is a division of application No. 10/186,411, filed on Jul. 1, 2002, now Pat. No. 7,291,363.

(60) Provisional application No. 60/301,984, filed on Jun. 30, 2001.

(51) Int. Cl.
*G02B 26/02* (2006.01)
*G02B 26/00* (2006.01)

(52) U.S. Cl. ............... 359/223.1; 359/237; 359/290

(58) Field of Classification Search .......... 359/223–225, 359/290–292, 295, 245, 260–263, 298, 198, 359/301–303, 317–318, 237, 242
See application file for complete search history.

(56) References Cited

U.S. PATENT DOCUMENTS

| | | | |
|---|---|---|---|
| 3,790,080 A | 2/1974 | Babington | |
| 4,224,173 A | 9/1980 | Reick | |
| 6,028,690 A | 2/2000 | Carter et al. | |
| 7,045,170 B1 * | 5/2006 | Hankins et al. | 427/255.18 |
| 7,291,363 B2 | 11/2007 | Miller | |
| 7,738,154 B2 | 6/2010 | Miller | |
| 2002/0122894 A1 | 9/2002 | Brenner et al. | |

* cited by examiner

*Primary Examiner* — Dawayne Pinkney
(74) *Attorney, Agent, or Firm* — Charles A. Brill; Wade James Brady, III; Frederick J. Telecky, Jr.

(57) ABSTRACT

A method of lubricating MEMS devices using fluorosurfactants 42. Micro-machined devices, such as a digital micromirror device (DMD™) 940, which make repeated contact between moving parts, require lubrication in order to prevent the onset of stiction (static friction) forces significant enough to cause the parts to stick irreversibly together, causing defects. These robust and non-corrosive fluorosurfactants 42, which consists of a hydrophilic chain 40 attached to a hydrophobic fluorocarbon tail 41, are applied by nebulization and replace the more complex lubricating systems, including highly reactive PFDA lubricants stored in polymer getters, to keep the parts from sticking. This lubrication process, which does not require the use of getters, is easily applied and has been shown to provide long-life, lower-cost, operable MEMS devices.

4 Claims, 5 Drawing Sheets

LUBRICATING MICRO-MACHINED DEVICES USING FLUOROSURFACTANTS

This application is a divisional of application Ser. No. 11/934,776, filed Nov. 4, 2007, which is a divisional of application Ser. No. 10/186,411, filed Jul. 1, 2002, now U.S. Pat. No. 7,291,363, which claims the benefit of provisional Application No. 60/301,984, filed Jun. 30, 2001.

FIELD OF THE INVENTION

The present invention relates to micro-electro-mechanical systems (MEMS) devices and particularly to lubricating the surfaces of the moving parts in such devices.

BACKGROUND OF THE INVENTION

Micro-machined or micro-electro-mechanical systems (MEMS) devices, where there is repeated physical contact between moving parts, require lubrication to prevent the onset of stiction (static friction). This stiction can be strong enough to cause the parts to stick irreversibly together, making the devices inoperable.

For example, in the digital micromirror device (DMD™) of FIG. 1, which is one type of a MEMS device, the mirror/yoke 10/11 assemblies rotate on torsion hinges 12 attached to support posts 13 until the yoke tips 14 contact (land on) landing pads 15 located on a lower substrate layer 16. It is this mechanical contact between the yoke landing tips 14 and the landing pad sites 15 that is of particular relevance to this invention. In some cases the mirror/yoke assemblies become slow in lifting off the landing pad, affecting the response of the device and in other cases the assemblies become permanently stuck to the landing pads. One of the primary causes of stiction has been shown to be that of the landing tips scrubbing into the metal landing pads.

This "sticking" problem has been addressed by lubricating or passivating the metal surfaces of the devices to make them "slick." Getters have been used in the device package to store the lubricants in order to maintain a low stiction environment for all moving parts over long device lifetimes. One lubricant used is powdered perfluordecanoic acid (PFDA), which tends to decrease the Van der Waals forces associated with the mirror assemblies in the DMD™ or any moving parts in a MEMS device, and thereby reduces the tendency for the mirrors to stick to the landing pads. However, PDFA has a very reactive molecule, which can react with other package constituents, causing severe damage to the device.

FIG. 2 is a drawing of a typical DMD™ device package. This shows the DMD™ 21 mounted in a package frame 20 with attached cover glass (package lid) 22. The cover glass 20 is usually made opaque 23 on the underside with a transparent aperture for optical interfacing with the device. As mentioned, this stiction problem has normally been addressed by attempting to control the environment inside the packages. For example, FIG. 3 illustrates how PFDA getters 31 and/or moisture gathering getters are attached to the underside of the glass cover 30 by means of an adhesive 32. The getters are used to both collect moisture in the package and provide lubrication (PFDA) to the moving parts in the DMD™. These getters may also be installed in empty areas within the package cavity. However, the PFDA lubricants are reactive and difficult to handle in a manufacturing environment and as a result, tend to drive up the cost of packaged MEMS devices. The moisture getters are used to control rather large amounts of moisture in the package, which should only be present if the getters themselves are misprocessed.

What is needed is a robust, non-corrosive lubricant that can be easily applied, without the use of getters, to the surface of MEMS devices to prevent the moving parts from sticking together. The fluorosurfactant lubricant of the present invention meets these requirements.

SUMMARY OF THE INVENTION

This invention discloses a method of lubricating MEMS devices using fluorosurfactants. Micro-machined devices, which make repeated contact between moving parts, require lubrication in order to prevent the onset of stiction (static friction) forces significant enough to cause the parts to stick irreversibly together. These fluorosurfactants, which are applied by nebulization and therefore do not require the use of getters, replaces complex lubricating systems in conventional devices, including highly reactive PFDA lubricants stored in polymer getters, to keep the parts from sticking. Although fluorosurfactants are overall stickier than the commonly used PFDA lubricants, they are easy to apply, tend to be non-reactive to MEMS surfaces, and have been shown to be effective in providing longer-life, lower-cost, devices with no additional sticking parts after an initial burn-in period.

Fluorosurfactants contains a hydrophilic (water like) chain attached to a hydrophobic fluorocarbon. The molecules spontaneously align with the hydrophillic regions pointed towards the surfaces of the device's moving parts with the hydrophobic fluorocarbons pointing into the air between the parts. When the moving parts touch, they are lubricated by the fluorocarbons. The material is a liquid, and if scraped away by the contacting parts, it will spontaneously flow back into the contact area, restoring lubrication around the point of contact.

BRIEF DESCRIPTION OF THE DRAWINGS

For a more complete understanding of the present invention, and the advantages thereof, reference is now made to the following descriptions taken in conjunction with the accompanying drawings, in which:

FIG. 7a shows over 10,000 micro-mirrors landed in the positive direction and then the mirrors being released as the applied energy is reduced. FIG. 7b shows over 10,000 micro-mirrors landed in the negative direction and then the mirrors being released as the applied energy is reduced.

DETAILED DESCRIPTION OF THE PREFERRED EMBODIMENTS

The present invention uses a fluorosurfactant to lubricate the moving parts of a MEMS device. These fluorosurfactants are readily available materials that can be applied to the surfaces of the devices by a nebulization procedure, which is akin to spraying it on but with very small particles of the material. These lubricants, which are non-corrosive and very compatible with the MEMS fabrication process, remain robust over long extended periods of time.

Figure 1:
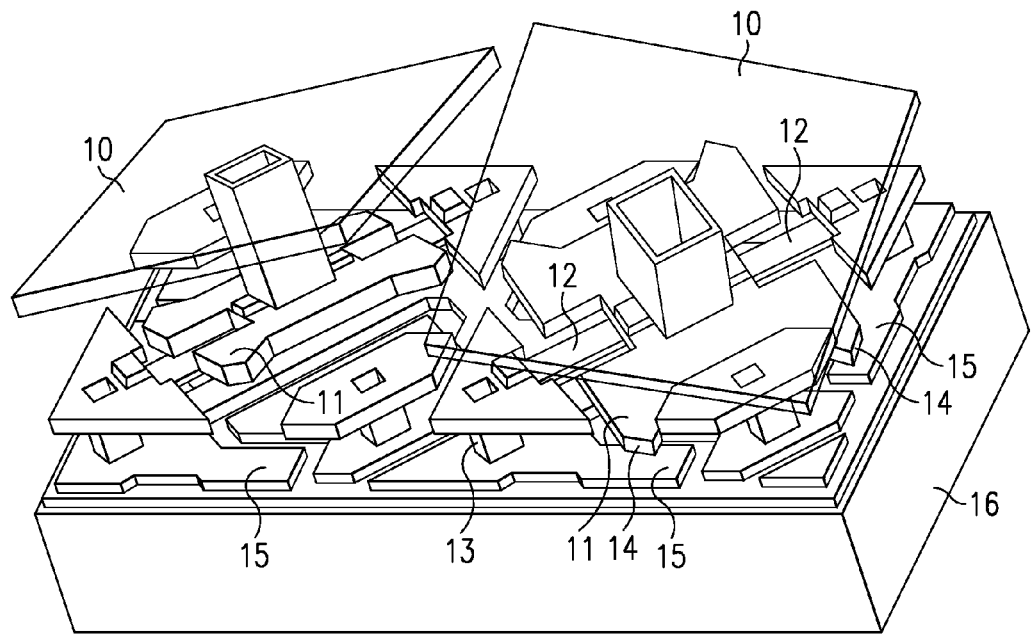
FIG. 1 is a drawing of a DMD™, one type of MEMS device, with moving part that requires lubrication to prevent the parts from sticking, thereby making the device inoperable.
Figure 2:
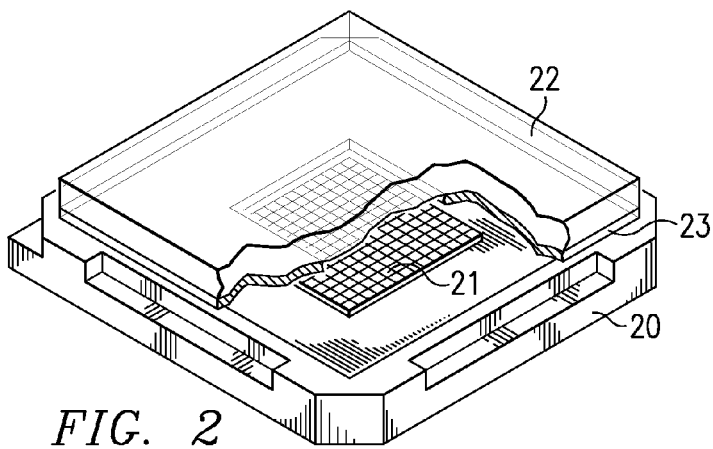
FIG. 2 is a drawing of a typical DMD™ package with getters added to provide a controlled environment to help prevent stiction between the MEMS device's moving parts.
Figure 3:
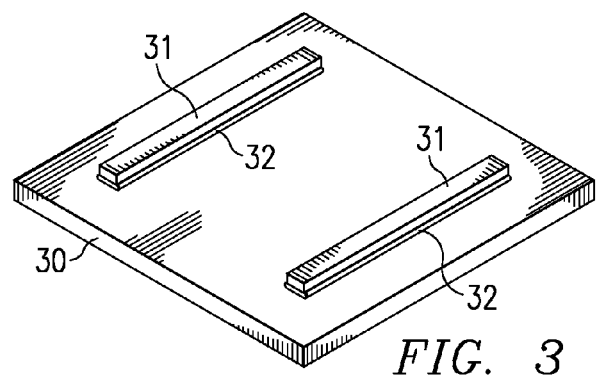
FIG. 3 is a drawing showing getters used for both storing PFDA lubricants and for collecting moisture inside a typical MEMS package to help prevent the moving parts from sticking.
Figure 4:
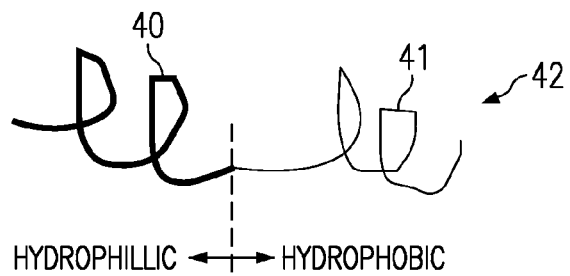
FIG. 4 is a sketch showing the hydrophillic and hydrophobic sides of the fluorosurfactant used in the present invention.

FIG. 4 is a sketch describing the fluorosurfactant 42 of the present invention. The surfactant 42 contains a hydrophillic 40 (water like) chain or tail attached to a hydrophobic 41 fluorocarbon tail. While the hydrophillic 40 regions are capable of uniting with or taking up water, the hydrophobic fluorocarbon 41 regions do not take up water, but contain non-reactive halo-carbons; i.e., such as carbon, fluorine, and in some cases hydrogen.

Figure 5:
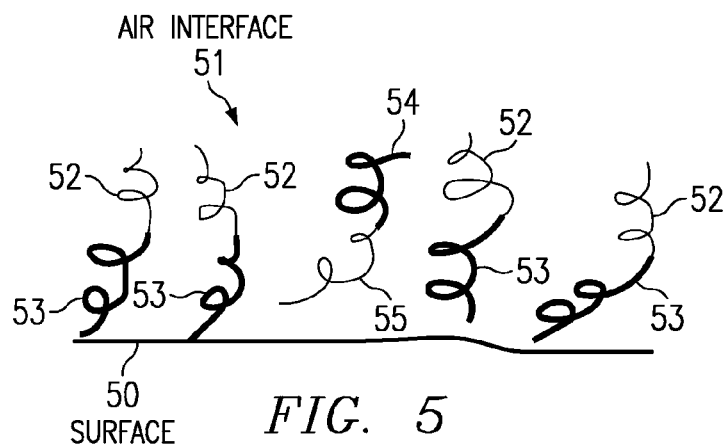
FIG. 5 is a sketch illustrating how the fluorosurfactant lubricant molecules spontaneously align with the hydrophillic regions pointed towards the surface of the parts and the hydrophobic fluorocarbon tails pointing into the air between the moving parts.

When applied to a MEMS device, the surfactant molecules will display some degree of local order at the surface the device, as described in FIG. 5. Generally, molecules of the fluorosurfactant will spontaneously align with their fluoronated hydrophobic tails 52 pointing towards the air interface 51 and the hydrophillic tails 53 pointing towards the surface 50 of the device. For some surfactants, 100 percent of the molecules will align this way to give a crystalline order. However for most surfactants there will be a few stragglers that will align in the opposite direction with the hydrophillic tail 54 pointing towards the air interface 51 and the hydrophobic tail 55 pointing towards the surface 50, although most of the molecules will align in the correct way, as shown.

Figure 6:
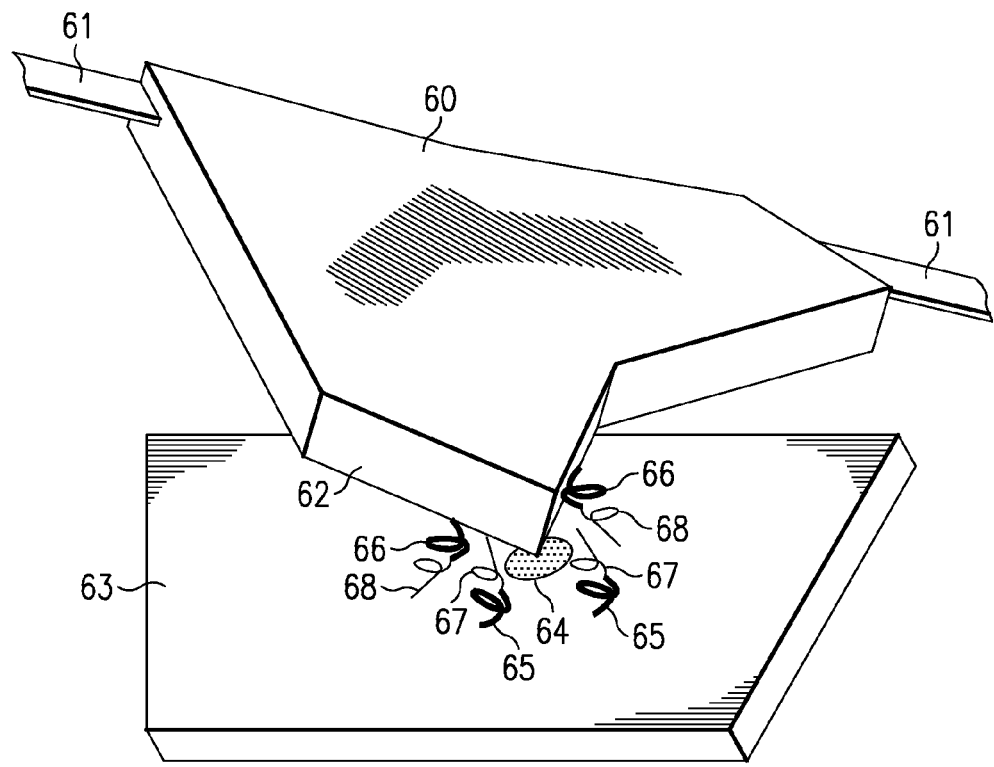
FIG. 6 is a sketch illustrating the effect of surfactant lubrication of the present invention, showing the molecules spontaneously aligning with the hydrophillic regions pointed towards the surface of the moving parts in the MEMS device and the hydrophobic fluorocarbon tails pointing into the air between the moving parts, providing lubrication to the moving parts.

FIG. 6 is a sketch illustrating the effect of fluorosurfactant lubrication on the moving parts in a DMD™ MEMS device, where the mirror yoke 60 rotates on torsion hinges 61 until the tip 62 of the yoke makes contact 64 (lands on) with the landing pad 63. This illustrates the surfactant molecules properly aligned with the hydrophillic tails 65,66 pointing towards the surface of the landing pad 63 and yoke assembly 60, respectively, and the hydrophobic tails 67,68 pointing into the air interface between the moving parts. In operation, when the moving parts touch, they are lubricated by the fluorocarbons. Since the material is a liquid, when it is scraped or scrubbed away during contact of the parts, it will spontaneously flow back into the contact area 64, restoring lubrication and preventing sticking of the parts.

Figure 7A:
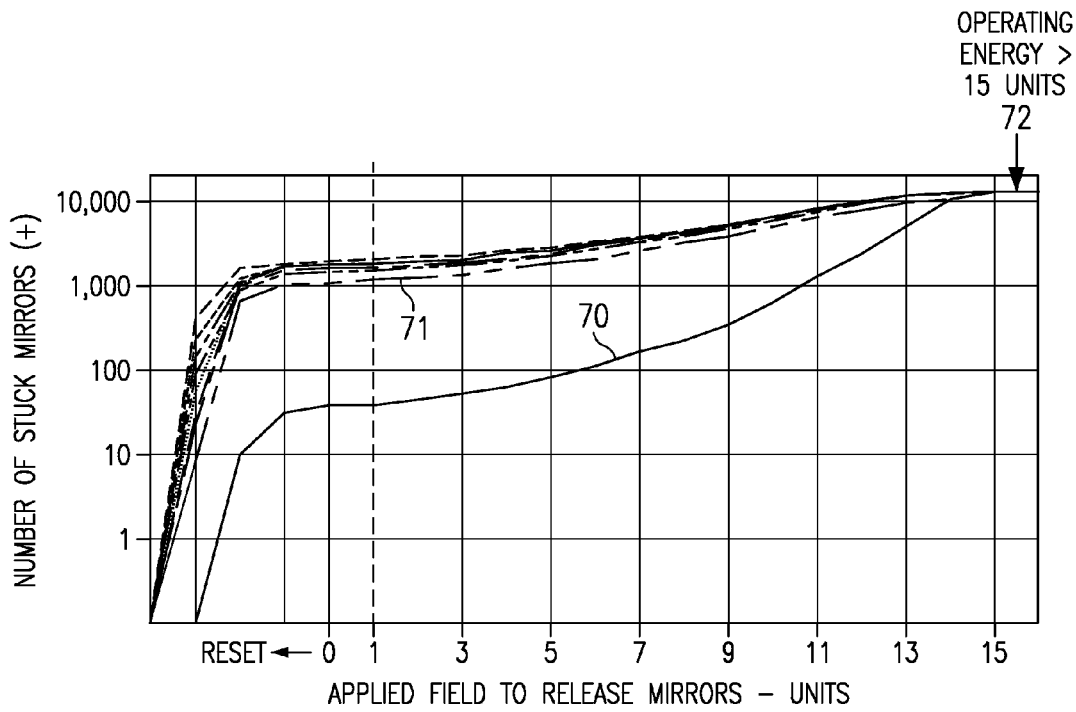
FIGS. 7a and 7b are graphs of life test data for DMD™ devices lubricated with the fluorosurfactant of the present invention, showing that after an initial burn-in period there are very few new defects at normal operating voltages, which indicates the effectiveness of this lubrication.
Figure 7B:
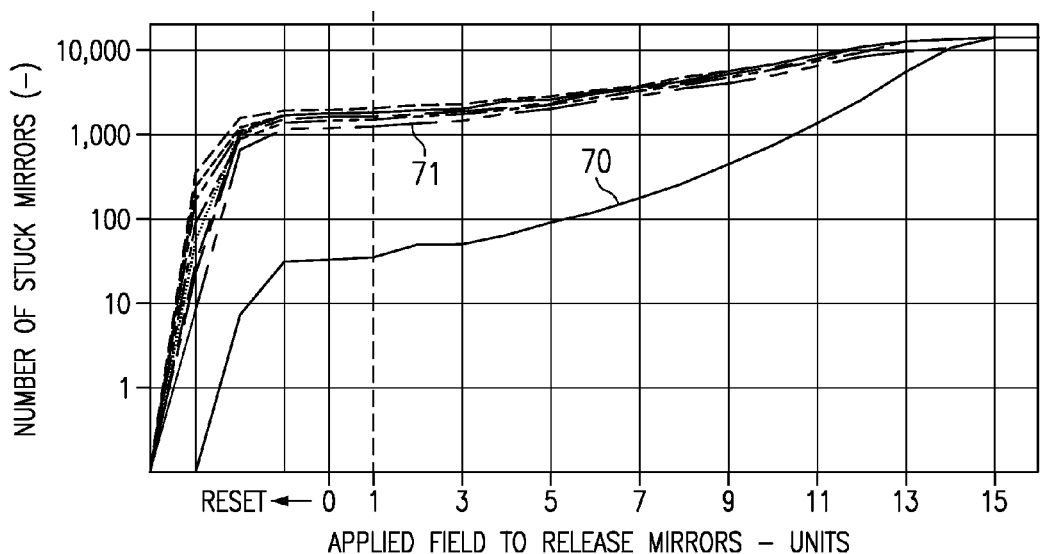

FIGS. 7a and 7b are graphs showing the results of life testing DMD™ devices lubricated with the fluorosurfactant of the present invention. This shows data taken after the surfactant was applied at 0 hours 70 before burn-in and then for multiple additional readings 71 taken up to 5000 hours later. This shows the effectiveness of lubricating the moving parts with the fluorosurfactant of the present invention. In FIG. 7a, sufficient energy (>15 units) is applied to land over 10,000 micro-mirrors in the positive (+x degrees) direction. Similarly, in FIG. 7b, sufficient energy is applied to land over 10,000 micro-mirrors in the negative (−x degrees) direction. In both cases, as the operating energy is decreased from >15 units (normal operating energy is >15 units) to 0 units, more than 90% of the landed mirrors lift-off their landing pads. Below 0 energy, a reset voltage is applied to lift-off the remaining mirrors that are not permanently stuck. As shown, after an initial burn-in period 70, the device stabilizes with the mirrors lifting-off consistently, without additional stuck mirrors, as the energy is decreased and the reset voltage is applied.

Figure 8:
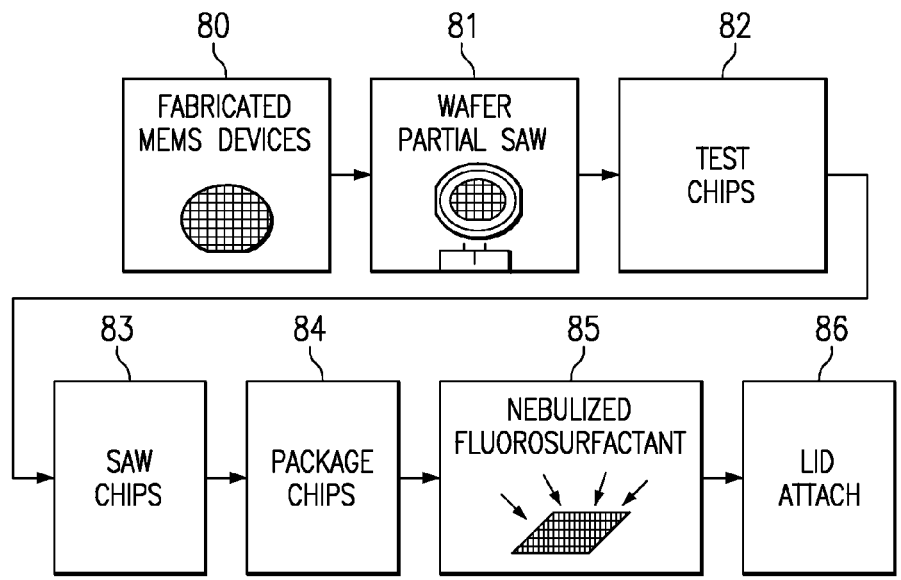
FIG. 8 is a process flow diagram for the back-end fabrication of a MEMS device that is lubricated with the fluorosurfactant of the present invention.

FIG. 8 is a process flow diagram for the back-end fabrication of a MEMS device that is lubricated with the fluorosurfactant of the present invention. The process is comprised of fabricating wafers 80 of a particular MEMS device having moving parts, partially sawing 81 the devices apart but leaving them slightly attached, testing 82 the individual chips on the wafer, completing the sawing 83 or separation of the chips, packaging the individual chips 84, nebulizing 85 by spraying the surfaces of the chips with a fine mist of the fluorosurfactant of the present invention, and attaching lids 86 or cover glasses to the package. Although shown applied at the device level, the nebulization can also be applied at the wafer level. This process uses readily available surfactants, which are robust over time, to provide lubrication to all moving parts of the MEMS device. The process is non-corrosive relative to the typical materials found in MEMS devices. A range of various surfactants can be used to prevent stiction in MEMS devices, while at the same time eliminating the need for getters and thereby reducing the packaging costs of the devices substantially.

Figure 9:
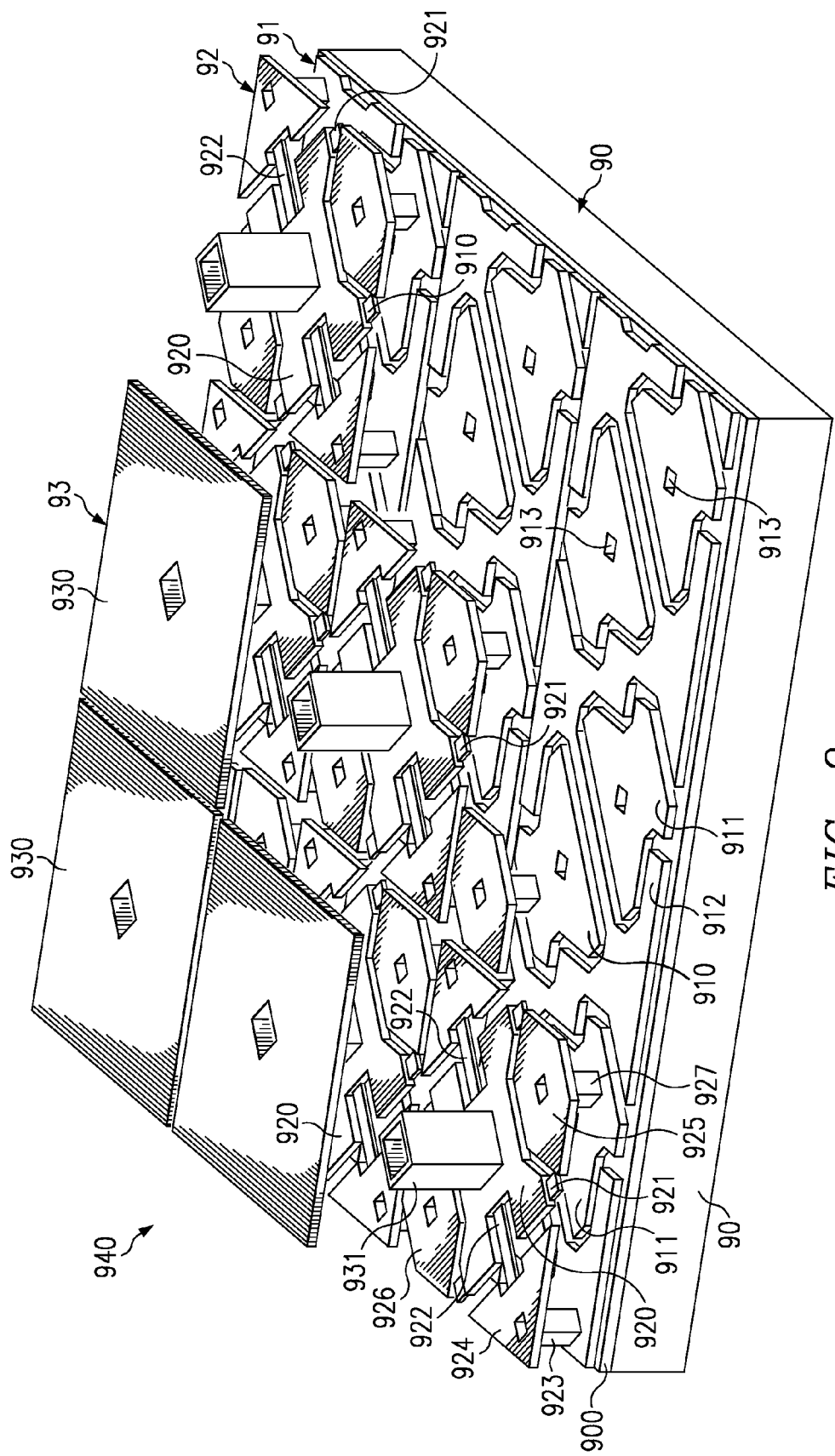
FIG. 9 is a cut-away drawing of a wafer of DMD™ devices showing the rotating yoke/mirror assembly (moving part), where the surfaces are nebulized with the fluorosurfactant of the present invention to prevent sticking.

FIG. 9 shows a small portion of a DMD™ 940 device that is built-up in four levels, these being a memory substrate level 90, an address electrode/landing pad level 91, a yoke/hinge level 92, and a mirror level 93, as indicated.

The substrate 90 contains an orthogonal array of CMOS address circuits over which a reflective micro-mirror superstructure with mechanical moving parts is fabricated. A thick oxide 900 isolation layer, which has vias for connecting to the CMOS address circuits, is placed on top of the CMOS array in the substrate.

The mirror superstructure is then fabricated on top of this isolation layer 900, beginning with an Aluminum metal-3 layer 91, which includes yoke address electrodes 910,911 and landing pads 912. The address electrodes 910,911 connect through vias 913 to the respective binary outputs of the CMOS address circuits in the substrate 90.

The next layer 92 consists of the yoke 920 and torsion hinge 922 structure, mirror address electrodes 925/926, electrode post 927 and hinge posts 923 and post caps 924. The yoke 920, which supports a mirror assembly 930 on the top level 93, is suspended in air above the metal-3 layer 91 and rotates about a diagonal axis, on the torsion hinges 922, until the yoke landing tips 921 contact the landing pads 912 below. The geometry of the yoke 920 and the spacing between the metal-3 level 91 and the yoke/hinge level 92 determines the tilt angle of the yoke/mirror structure. The hinge posts 923 sit on top of and in contact with the metal landing pads 912 at the metal-3 level 91, so that the yoke and landing pads are at the same electrical potential. The mirror address pads 925/926 are attached to the yoke addressing pads 910/911 by additional posts 927.

The top level 93 consists of the reflective mirrors 930 and mirror posts 931, which ride on top of the yoke 905, tilting typically +/− 10°.

In operation, electrostatic forces cause the mirror/yoke structure 930/920 to rotate on its torsion axis, defined along the torsion hinges. These electrostatic forces are established by the voltage potential difference between the yoke address electrodes 910/911 and the yoke 920 and between the mirror address electrodes 925/926 and the mirror 930, respectively. In each case, these forces are a function of the reciprocal of the distance between the two plates; i.e., 910/911 and 920 and 925/926 and 930. As the rigid yoke/mirror structure rotates on its axis, the torsion hinges 922 resist deformation with a restoring torque that is an approximate linear function of the angular deflection of the structure. The structure rotates until either this restoring torsion beam torque equals the established electrostatic torque or until the yoke/mirror structure is mechanically limited in its rotation, i.e., the yoke tips 921 land on the landing pads 912. It is at this point of contact between the yoke tips 921 and the landing pads 912 that stiction occurs, which can render a particular mirror permanently inoperable or slow to respond to the electrostatic forces, thereby causing a device defect.

By nebulization of the metal surfaces of the devices using the fluorosurfactant of the present invention, highly reliable, lower-cost, DMD devices can be produced. Although overall these parts have stickier surfaces than conventional PFDA lubricated parts, the mirrors have been shown to be effective in lifting off their landing pads without additional stuck mirrors, after an initial burn-in period. Test devices have been operated for a period of >5000 hours with no additional stuck mirrors. This process is effective since the molecules of the fluorosurfactant spontaneously align with their fluoronated hydrophobic tails 52 pointing towards the air interface 51 and between the moving parts their hydrophillic tails 53 pointing towards the moving surfaces 50 of the device, thereby lubricating the areas of contact between moving parts. As the lubricant is scrubbed away during contact, the surfactant quickly flows back into the area to assure a lubricated contact, thereby eliminating sticking between the parts. Also, the fluorosurfactants are non-corrosive to the typical surfaces of MEMS device, thereby leading to a long operating life for the devices.

Figure 10:
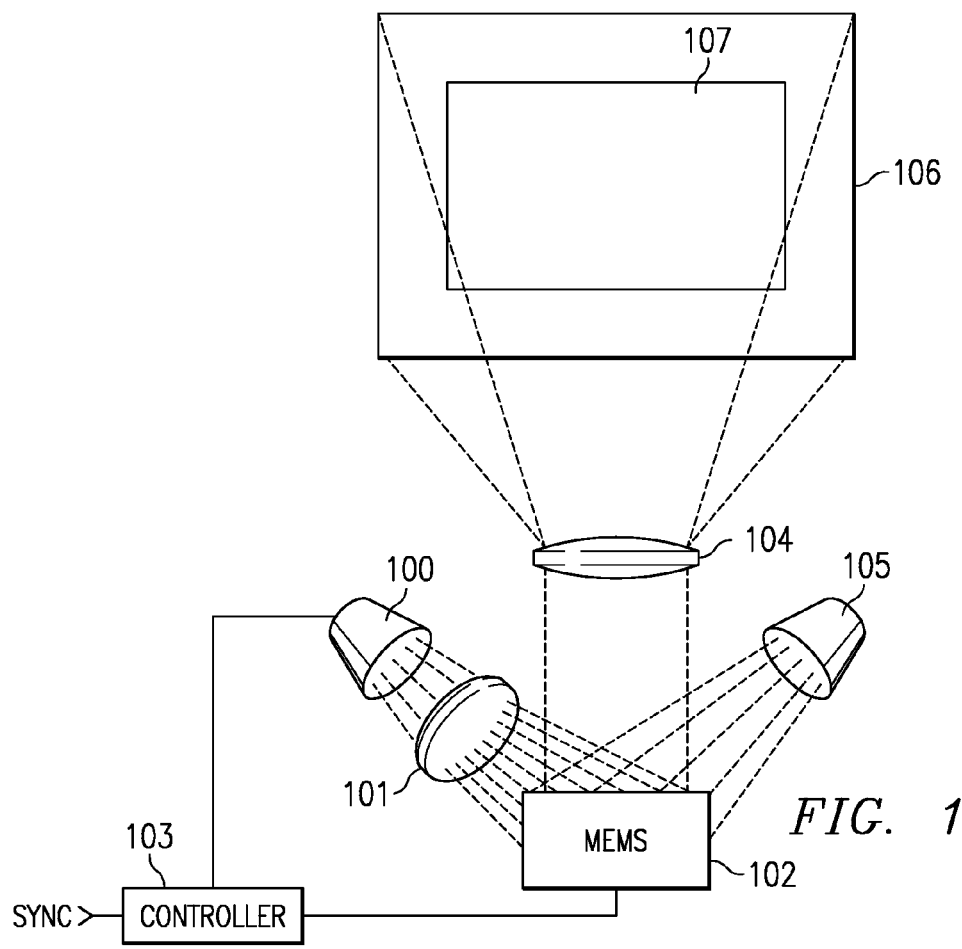
FIG. 10 is a block diagram of a MEMS based projection display system where the lifetime of the system is considerably extended through the nebulization of the MEMS moving parts with the fluorosurfactant of the present invention.

FIG. 10 is a block diagram of a MEMS based projection display system where the lifetime of the system is considerably extended through the nebulization of the MEMS device's moving parts with the fluorosurfactant of the present invention. One example of such a system is a DMD™ projection display. In the projector, light from a light source 100 is focused on to the MEMS DMD™ device 102 by means of a condenser lens 101, placed in the path of the light. An electronic controller 103, is connected to both the DMD™ 102 and the light source 101 and used to modulate the DMD™ 102 and to control the light source 100. For all DMD™ pixels positioned towards the light source (ON pixels), the incoming light beam is reflected into the focal plane of a projection lens 104, where it resized and projected on to a viewing screen 106 to form an image 107. On the other hand, DMD™ pixels positioned away from the light source (OFF pixels), as well as any stray light reflected from various near flat surfaces on and around the DMD™, are reflected into a dark trap 105 and discarded.

In operation, if a DMD™ mirror sticks in either the ON or OFF binary state it causes a bright white or solid black defect on the display screen, respectively. For obvious reasons, more than just a handful of these defects are unacceptable in a display. By applying the process of the present invention where all surfaces of the MEMS device are nebulized with a fluorosurfactant, the moving parts are sufficiently lubricated to eliminate the sticking of mirrors over the required long lifetimes of the projector.

While this invention has been described in the context of preferred embodiments, it will be apparent to those skilled in the art that the present invention may be modified in numerous ways and may assume embodiments other than that specifically set out and described above. Accordingly, it is intended by the appended claims to cover all modifications of the invention that fall within the true spirit and scope of the invention.

What is claimed is:

1. A back-end process for fabricating MEMS devices with fluorosurfactant lubricated micro-machined parts, comprising the steps of:
    fabricating a wafer of said MEMS devices;
    partially sawing said wafer of said MEMS devices;
    testing said wafer of said partially sawn MEMS devices;
    completing sawing said wafer of said MEMS devices;
    packaging operable devices from said sawn wafer of MEMS devices;
    lubricating all surfaces of said packaged MEMS devices by applying a nebulized fluorosurfactant to said surfaces, wherein said fluorosurfactant contains a water-like hydrophillic chain attached to a hydrophobic fluorocarbon; and
    attaching a lid to said package.

2. The process of claim 1, wherein:
    said hydrophillic regions of said fluorosurfactant spontaneously aligns towards the surface of said moving parts of a MEMS device;
    said hydrophobic fluorocarbon tails of said fluorosurfactant aligns pointing into the air between the moving parts of said MEMS device; and
    the areas of contact between said moving parts are lubricated.

3. The process of claim 2, wherein said fluorosurfactant remains a liquid at the surface of said moving parts, such that when scrapped away by contacting surfaces of said moving parts, said fluorosurfactant spontaneously flows back, restoring lubrication to said contact area.

4. The process of claim 1, further comprising the step of lubricating all surfaces of said MEMS devices at the wafer level by applying a nebulized fluorosurfactant to said surfaces.

* * * * *